(12) United States Patent
Okumura et al.

(10) Patent No.: US 10,964,875 B2
(45) Date of Patent: Mar. 30, 2021

(54) SEMICONDUCTOR DEVICE MANUFACTURING METHOD

(71) Applicant: NITTO DENKO CORPORATION, Ibaraki (JP)

(72) Inventors: Keisuke Okumura, Ibaraki (JP); Satoshi Honda, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 15/777,134

(22) PCT Filed: Oct. 4, 2016

(86) PCT No.: PCT/JP2016/079522
§ 371 (c)(1),
(2) Date: May 17, 2018

(87) PCT Pub. No.: WO2017/086043
PCT Pub. Date: May 26, 2017

(65) Prior Publication Data
US 2019/0051807 A1    Feb. 14, 2019

(30) Foreign Application Priority Data

Nov. 18, 2015    (JP) .............................. JP2015-225440

(51) Int. Cl.
*H01L 35/34*    (2006.01)
*H01L 35/08*    (2006.01)
(Continued)

(52) U.S. Cl.
CPC ................ *H01L 35/34* (2013.01); *B22F 3/10* (2013.01); *H01L 27/16* (2013.01); *H01L 35/08* (2013.01); *H01L 35/28* (2013.01); *H01L 35/16* (2013.01)

(58) Field of Classification Search
CPC ......... H01L 35/34; H01L 35/28; H01L 35/08; H01L 35/16; H01L 27/16; B22F 3/10
See application file for complete search history.

(56) References Cited

U.S. PATENT DOCUMENTS 5,969,290 A    10/1999    Kagawa et al.
2010/0275435 A1    12/2010    Hiroyama
(Continued)

FOREIGN PATENT DOCUMENTS

JP    04-010674 A    1/1992
JP    8-64875 A    3/1996
(Continued)

OTHER PUBLICATIONS

English machine translation of JP2014-236106A to Hayashi (Year: 2014).*

(Continued)

*Primary Examiner* — Laura M Menz
*Assistant Examiner* — Candice Chan
(74) *Attorney, Agent, or Firm* — Hauptman Ham, LLP

(57) ABSTRACT

Provided is a semiconductor device manufacturing method which can suppress the occurrence of positional deviation or inclination of a semiconductor element when the semiconductor element is fixed so as to be sandwiched-between two insulating substrates. The semiconductor device manufacturing method includes: obtaining a laminated body in which a semiconductor element is temporarily adhered on a first electrode formed on a first insulating substrate with a first pre-sintering layer sandwiched therebetween; temporarily adhering the semiconductor element on a second electrode formed on a second insulating substrate with a second pre-sintering layer sandwiched therebetween, the second pre-sintering layer being provided on a side opposite to the first pre-sintering layer, to obtain a semiconductor device (Continued)

precursor; and simultaneously heating the first pre-sintering layer and the second pre-sintering layer, to bond the semiconductor element to the first electrode and the second electrode.

2 Claims, 4 Drawing Sheets

(51) Int. Cl.
   *B22F 3/10* (2006.01)
   *H01L 27/16* (2006.01)
   *H01L 35/28* (2006.01)
   *H01L 35/16* (2006.01)

(56) References Cited

U.S. PATENT DOCUMENTS

| | | |
|---|---|---|
| 2012/0000501 A1 | 1/2012 | Morisaki et al. |
| 2012/0160293 A1* | 6/2012 | Jinushi .................... H01L 35/08 136/237 |
| 2015/0132473 A1 | 5/2015 | Petkie |

FOREIGN PATENT DOCUMENTS

| | | |
|---|---|---|
| JP | 8-186298 A | 7/1996 |
| JP | 10-70318 A | 3/1998 |
| JP | 10-313134 A | 11/1998 |
| JP | 2000-349350 A | 12/2000 |
| JP | 2003-282796 A | 10/2003 |
| JP | 2004-221109 A | 8/2004 |
| JP | 2009-65046 A | 3/2009 |
| JP | 2012-15220 A | 1/2012 |
| JP | 2012-134410 A | 7/2012 |
| JP | 2014-236106 A | 12/2014 |

OTHER PUBLICATIONS

English machine translation of JP2000-349350A to Onoe et al. (Year: 2000).*
The extended European search report for corresponding European application No. 16866045.4 dated Oct. 15, 2018.
The International Preliminary Report for corresponding International Application No. PCT/JP2016/079522 dated May 31, 2018.
International Search Report for corresponding international application PCT/JP2016/079522 dated Dec. 27, 2016.
Japanese Office Action dated Nov. 28, 2019 for corresponding Japanese Application No. 2015-225440 with English translation.
Taiwanese Office Action dated Feb. 26, 2020 corresponding to Taiwanese Application No. 10920169370.

* cited by examiner

SEMICONDUCTOR DEVICE MANUFACTURING METHOD

CROSS REFERENCE TO RELATED APPLICATIONS

This application claims the priority of Japanese Patent Application No. 2015-225440, filed on Nov. 18, 2015, in the Japanese Patent Office. Further, this application is the National Phase application of International Application No. PCT/JP2016/079522 filed on Oct. 4, 2016, which is incorporated herein by reference in its entirety.

TECHNICAL FIELD

The present invention relates to a method of manufacturing a semiconductor device such as a thermoelectric conversion module.

BACKGROUND ART

Conventionally, a thermoelectric conversion module has a configuration in which a plurality of P-type thermoelectric elements and N-type thermoelectric elements are alternately arranged, and fixed so as to be sandwiched between two insulating substrates (see, for example, Patent Document 1). On each of the insulating substrates, electrodes are formed at positions corresponding to the thermoelectric elements, and the P-type thermoelectric elements and the N-type thermoelectric elements are electrically connected in series in order.

Patent Document 1 discloses a method of manufacturing a thermoelectric conversion module in which a highly-adhesive flux is applied to at least one of an insulating substrate and solder plating attached to a thermoelectric element to temporarily fix the thermoelectric element to the insulating substrate, followed by soldering using solder plating while applying heat.

In Patent Document 1, one surface of the thermoelectric element is temporarily fixed to an electrode of one of the insulating substrates, followed by heating to bond the thermoelectric element to the electrode. Then, an electrode of the other insulating substrate is bonded to the other surface of the thermoelectric element.

PRIOR ART DOCUMENTS

Patent Documents

Patent Document 1: JP-A-04-10674

SUMMARY OF THE INVENTION

Problems to be Solved by the Invention

However, the method of Patent Document 1 uses a solder for bonding, and the insulating substrate which has been already bonded is also heated when heating is performed in order to bond the other insulating substrate, which causes the solder to be re-melted, so that the positional deviation or inclination of the thermoelectric element may occur.

The present invention has been made in view of the above problems, and an object thereof is to provide a semiconductor device manufacturing method which can suppress the occurrence of positional deviation or inclination of a semiconductor element when the semiconductor element is fixed so as to be sandwiched between two insulating substrates.

Means for Solving the Problems

In order to solve the above-mentioned conventional problems, the present inventors studied a semiconductor device manufacturing method. As a result, it has been found that the occurrence of positional deviation or inclination of a semiconductor element can be suppressed by adopting the following configuration, and the present invention was completed.

That is, a semiconductor device manufacturing method according to the present invention includes:

a step A of obtaining a laminated body in which a semiconductor element is temporarily adhered on a first electrode formed on a first insulating substrate, with a first pre-sintering layer sandwiched therebetween;

a step B of, after the step A, temporarily adhering the semiconductor element on a second electrode formed on a second insulating substrate, with a second pre-sintering layer sandwiched therebetween, the second pre-sintering layer being provided on a side opposite to the first pre-sintering layer, to obtain a semiconductor device precursor; and a step C of, after the step B, simultaneously heating the first pre-sintering layer and the second pre-sintering layer, to bond the semiconductor element to the first electrode and the second electrode.

According to the above configuration, the semiconductor element is first temporarily adhered on the first electrode formed on the first insulating substrate and the second electrode formed on the second insulating substrate. Then, the first pre-sintering layer and the second pre-sintering layer are simultaneously heated, to bond the semiconductor element to the first electrode and the second electrode. That is, by heating once, the semiconductor element and the first electrode are bonded, and the semiconductor element and the second electrode are bonded. Since the bonding of both the surfaces of the semiconductor element is completed by heating once, the re-melting of the pre-sintering layer does not occur. As a result, the occurrence of positional deviation or inclination of the semiconductor element can be suppressed.

The semiconductor element is temporarily adhered on the first pre-sintering layer and the second pre-sintered layer, which makes it unnecessary to use a mold or the like for preventing the falling of the semiconductor element. As a result, the breakage of the semiconductor element due to the rubbing of the mold or the like can be prevented.

The temporary adhesion is provided by using the first pre-sintering layer and the second pre-sintering layer as a bonding material, which does not separately require a tape or an adhesive for temporary fixing. Therefore, the semiconductor device manufacturing method is economically excellent.

It is preferable that, in the above configuration, the semiconductor element has a first surface on which the first pre-sintering layer is stacked and a second surface on which the second pre-sintering layer is stacked after the step A and before the step B.

After the step A and before the step B, the first pre-sintering layer is stacked on the first surface of the semiconductor element, and the second pre-sintering layer is stacked on the second surface, which allows the step B to be performed without performing the step of forming the second pre-sintering layer after the step A.

It is preferable that, in the above configuration, the semiconductor element having the first surface on which the first pre-sintering layer is stacked and the second surface on which the second pre-sintering layer is stacked is obtained by the following steps X and Y:

the step X of forming the first pre-sintering layer on a first surface of a semiconductor wafer and forming the second pre-sintering layer on a second surface of the semiconductor wafer, to obtain the semiconductor wafer including the pre-sintering layer formed on each of both the surfaces; and the step Y of making the semiconductor wafer obtained in the step X and including the pre-sintering layer formed on each of both the surfaces into individual pieces.

According to the above configuration, the semiconductor wafer is made into individual pieces in a state where the sintering pre-layer is formed on each of both the surfaces of the semiconductor wafer, which makes it possible to efficiently obtain the semiconductor wafer including the pre-sintering layer formed on each of both the surfaces.

It is preferable that, in the above configuration, the first pre-sintering layer and the second pre-sintering layer contain a metal-based compound.

The first pre-sintering layer and the second pre-sintering layer contain the metal-based compound, which provides good electrical connection with low electrical resistance after bonding.

It is preferable that, in the above configuration, in the step X, a sheet-like first pre-sintering layer is stacked on the first surface of the semiconductor wafer, and a sheet-like second pre-sintering layer is stacked on the second surface of the semiconductor wafer, to obtain the semiconductor wafer including the pre-sintering layer formed on each of both the surfaces.

The sheet-like pre-sintering layer has a relatively uniform thickness. Therefore, according to the above configuration, the sheet-like pre-sintering layer is used, which allows the inclination of the semiconductor element to be further suppressed.

It is preferable that, in the above configuration, the semiconductor element is a thermoelectric element.

The semiconductor element is the thermoelectric element, which makes it possible to obtain a thermoelectric conversion module in which the positional deviation or inclination of the thermoelectric element is suppressed.

MODE FOR CARRYING OUT THE INVENTION

Figure 1:
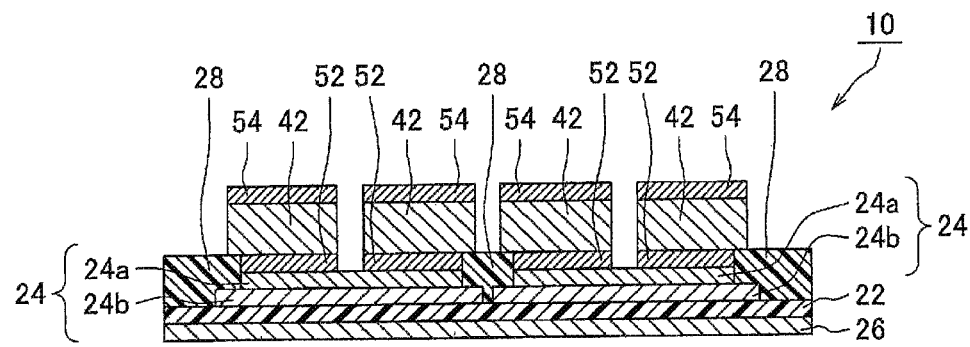
FIG. 1 is a schematic cross-sectional view for describing a semiconductor device manufacturing method according to an embodiment.

Hereinafter, a semiconductor device manufacturing method according to an embodiment will be described with reference to the drawings. Prior to this, a first pre-sintering layer and a second pre-sintering layer used in the present embodiment will be described.

(First Pre-Sintering Layer)

A first pre-sintering layer 52 according to the present embodiment (see FIGS. 1 and 4) is a layer serving as a sintered layer after being heated.

In the present embodiment, a case will be described, in which the first pre-sintering layer is one layer serving as a sintered layer after being heated, but the present invention is not limited to this example. The layer serving as a sintered layer after being heated in the present invention may have a configuration in which a plurality of layers serving as a sintered layer after being heated are stacked.

The thickness of the first pre-sintering layer 52 is preferably 5 µm to 200 µm, more preferably 10 µm to 150 µm, and still more preferably 15 µm to 100 µm. The thickness of the first pre-sintering layer 52 before being heated to the above range is set, which allows maintenance of a sheet shape, and thickness uniformity to be secured.

The first pre-sintering layer 52 is pasted on a test chip (semiconductor chip, length: 2 mm×width: 2 mm, thickness: 3 mm) under the conditions of 0.5 MPa, 10 seconds, and 80° C. by a parallel plate press. The shear strength (shear strength assumed during temporary adhesion) of the test chip, on which the first pre-sintering layer 52 has been pasted, at room temperature (24° C.) is preferably in the range of 0.01 MPa to 1.0 MPa, and more preferably in the range of 0.1 MPa to 0.9 MPa.

Specifically, the shear strength is a value measured under the following conditions using Bond Tester 5000 Series for ultra-fine pitch bonding, manufactured by Nordson Advanced Technology Japan K. K. (former name: Dage Japan Co., Ltd.).

<Shear Strength Measurement Conditions>
Load cell: BS250
Measurement range: 250 g
Test type: Destructive test
Test speed: 100 µm/s
Descent speed: 100 µm/s
Test height: 100 µm
Tool movement amount: 2000 µm
Destructive recognition point: High (90%)

The first pre-sintering layer 52 is pasted on a test chip (semiconductor chip, length: 2 mm×width: 2 mm, thickness: 3 mm) under the conditions of 0.5 MPa, 10 seconds, and 80° C. by a parallel plate press. Then, the test chip on which the first pre-sintering layer 52 has been pasted is heated under the conditions of 1 MPa, 90 seconds, and 300° C. by a parallel plate press. The shear strength (shear strength assumed after thermal bonding) of the test chip at room temperature (24° C.) is preferably in the range of 2 MPa to 100 MPa, and more preferably in the range of 10 MPa to 90 MPa.

Specifically, the shear strength is a value measured under the following conditions using Multipurpose Bond Tester 4000 series manufactured by Nordson Advanced Technology Japan K. K. (former name: Dage Japan Co., Ltd.).

<Shear Strength Measurement Conditions>
Load cell: DS100 kg
Measurement range: 100 kg
Test type: Destructive test
Test speed: 100 μm/s
Descent speed: 100 μm/s
Test height: 100 μm
Tool movement amount: 2000 μm
Destructive recognition point: High (90%)

It is preferable that the hardness of the first pre-sintering layer 52 after being heated under the following heating condition A is in the range of 1.5 GPa to 10 GPa in measurement using a nanoindenter. The hardness is more preferably in the range of 2.0 GPa to 8 GPa, and still more preferably in the range of 2.5 GPa to 7 GPa. The following heating condition A is a heating condition prescribed by assuming a condition that the first pre-sintering layer 52 serves as a sintered layer after being heated. A method of measuring hardness using the nanoindenter is based on a method described in examples.

<Heating Condition A>
The first pre-sintering layer 52 is heated from 80° C. to 300° C. at a heating rate of 1.5° C./sec under pressure of 10 MPa, and then held at 300° C. for 2.5 minutes.

When the hardness is 1.5 GPa or more, the sintered layer obtained by heating the first pre-sintering layer 52 is solid. When the hardness is 10 GPa or less, the sintered layer obtained by heating the first pre-sintering layer 52 has appropriate flexibility.

The hardness can be controlled by the kind, content, and average particle diameter of metal fine particles, the kind and content of a thermally decomposable binder, the kind and content of a low-boiling binder, heating conditions when a sintered layer is formed by heating (for example, a temperature, a time, a heating rate, or the like), an atmosphere when the sintered layer is formed (air atmosphere, nitrogen atmosphere, reducing gas atmosphere, or the like).

The modulus of elasticity of the first pre-sintering layer 52 after being heated under the following heating condition A is preferably in the range of 30 GPa to 150 GPa in measurement using a nanoindenter. The modulus of elasticity is more preferably in the range of 35 GPa to 120 GPa, and still more preferably in the range of 40 GPa to 100 GPa. The following heating condition A is a heating condition prescribed by assuming a condition that the first pre-sintering layer 52 serves as a sintered layer after being heated. A method of measuring the modulus of elasticity using a nanoindenter is based on a method described in examples.

<Heating Condition A>
The first pre-sintering layer 52 is heated from 80° C. to 300° C. at a heating rate of 1.5° C./sec under pressure of 10 MPa, and then held at 300° C. for 2.5 minutes.

When the modulus of elasticity is 30 GPa or more, the sintered layer obtained by heating the first pre-sintering layer 52 is solid. When the modulus of elasticity is 150 GPa or less, the sintered layer obtained by heating the first pre-sintering layer 52 has appropriate flexibility.

The modulus of elasticity can be controlled by the kind, content, and average particle diameter of metal fine particles, the kind and content of a thermally decomposable binder, the kind and content of a low-boiling binder, heating conditions when a sintered layer is formed by heating (for example, a temperature, a time, a heating rate, or the like), an atmosphere when the sintered layer is formed (air atmosphere, nitrogen atmosphere, reducing gas atmosphere, or the like).

It is preferable that the deformation amount of the first pre-sintering layer 52 according to a deformation measurement method B described below is in the range of 1600 nm to 1900 nm. The deformation amount is more preferably in the range of 1620 nm to 1880 nm, and still more preferably in the range of 1650 nm to 1850 nm.

<Deformation Amount Measurement Method B>
(1) A step of heating the first pre-sintering layer 52 from 80° C. to 300° C. at a heating rate of 1.5° C./sec under pressure of 10 MPa, and then holding the first pre-sintering layer 52 at 300° C. for 2.5 minutes to obtain a layer for measuring a deformation amount; and (2) a step of pushing the layer for measuring a deformation amount by a pushing depth of 2 μm using a nanoindenter, releasing the pushing, and then measuring a deformation amount from before the pushing.

A more detailed deformation amount measurement method is based on a method described in examples.

When the deformation amount is 1900 nm or less, the obtained sintered layer is solid, and has improved reliability. On the other hand, when the deformation amount is 1600 nm or more, the obtained sintered layer has an elastic deformation region, and has improved reliability.

The first pre-sintering layer 52 has a carbon concentration of preferably 15% by weight or less, more preferably 12% by weight or less, and still more preferably 10% by weight or less. The carbon concentration is obtained by energy dispersive X-ray spectrometry after being heated from 23° C. to 400° C. in the air atmosphere at a heating rate of 10° C./min. When the carbon concentration is 15% by weight or less, an organic matter is hardly present in first pre-sintering layer 52 heated to 400° C. This provides excellent heat resistance after a thermal bonding step, and high reliability and heat characteristics even in a high-temperature environment.

In the first pre-sintering layer 52, a peak when differential thermal analysis is performed while heating from 23° C. to 500° C. in the air atmosphere at a heating rate of 10° C./min is preferably present at 150 to 350° C., more preferably 170 to 320° C., and still more preferably 180 to 310° C. When the peak is present at 150 to 350° C., an organic matter (for example, a resin component constituting the first pre-sintering layer 52) can be said to be thermally decomposed in this temperature range. This provides more excellent heat resistance after the thermal bonding step.

The first pre-sintering layer 52 preferably contains a metal-based compound. Examples of the metal-based compound include Au-based, Ag-based, and Cu-based metal fine particles.

Examples of the metal fine particles include sintering metal particles.

As the sintering metal particles, an aggregate of metal fine particles can be suitably used. Examples of the metal fine particles include fine particles made of a metal. Examples of the metal include gold, silver, copper, silver oxide, and copper oxide. Among these, the metal is preferably at least one selected from the group consisting of silver, copper, silver oxide, and copper oxide. The metal fine particles are made of at least one selected from the group consisting of silver, copper, silver oxide, and copper oxide, which can provide more suitable thermal bonding.

The average particle diameter of the sintering metal particles is preferably 0.0005 μm or more, and more preferably 0.001 μm or more. Examples of the lower limit of the average particle diameter include 0.01 μm, 0.05 μm, and 0.1 μm. On the other hand, the average particle diameter of the sintering metal particles is preferably 30 μm or less, and more preferably 25 μm or less. Examples of the upper limit of the average particle diameter include 20 μm, 15 μm, 10 μm, and 5 μm.

The average particle diameter of the sintering metal particles is measured by the following method. That is, the sintering metal particles are observed by a SEM (scanning electron microscope), to measure an average particle size. During SEM observation, for example, micro-sized sintering metal particles are preferably observed at a magnification of 5,000; submicron-sized sintering metal particles are preferably observed at a magnification of 50,000; and nano-sized sintering metal particles are preferably observed at a magnification of 300,000.

Examples of the shape of the sintering metal particles include a spherical shape, a rod shape, a scale shape, and an infinite shape without particular limitation.

The first pre-sintering layer 52 preferably contains metal fine particles in an amount in the range of 60 to 98% by weight relative to the entire first pre-sintering layer 52. The content of the metal fine particles is more preferably in the range of 65 to 97% by weight, and still more preferably in the range of 70 to 95% by weight. When the metal fine particles are contained in the range of 60 to 98% by weight, the metal fine particles can be sintered or melted to bond two objects (for example, a semiconductor element and an electrode).

The first pre-sintering layer 52 preferably contains a low-boiling binder. The low-boiling binder is used to facilitate the handling of the metal fine particles. The low-boiling binder is also used to adjust optional mechanical properties. Specifically, the low-boiling binder can be used as a metal fine particles-containing paste in which the metal fine particles are dispersed in the low-boiling binder.

The low-boiling binder is liquid at 23° C. Herein, the term "liquid" includes semiliquid. Specifically, it means that viscosity at 23° C. obtained by viscosity measurement with a dynamic viscoelasticity measuring device (rheometer) is 100,000 Pa·s or less.

Conditions for viscosity measurement are as follows.
Rheometer: MER III manufactured by Thermo SCIENTIFIC
Jig: Parallel plate: 20 mmφ, gap: 100 μm, shear rate: 1/sec)

Specific examples of the low-boiling binder include monohydric and polyhydric alcohols such as pentanol, hexanol, heptanol, octanol, 1-decanol, ethylene glycol, diethylene glycol, propylene glycol, butylene glycol, α-terpineol, 1,6-hexanediol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; and ethylene glycol ethyl ether acetate, ethylene glycol butyl ether acetate, diethylene glycol ethyl ether acetate, diethylene glycol butyl ether acetate, and dipropylene glycol methyl ether acetate (DPMA). These may be used in combination of two or more thereof. Among these, two kinds of low-boiling binders having different boiling points are preferably used in combination. When two kinds of low-boiling binders having different boiling points are used, an excellent sheet shape is maintained.

The first pre-sintering layer 52 preferably contains a thermally decomposable binder which is a solid at 23° C. When the first pre-sintering layer 52 contains the thermally decomposable binder, the shape of the sheet is likely to be maintained before the thermal bonding step. During the thermal bonding step, the first pre-sintering layer 52 is likely to be thermally decomposed.

Herein, the term "solid" specifically means that viscosity at 23° C. obtained by viscosity measurement with the rheometer is more than 100,000 Pa·s.

Herein, the term "thermally decomposable binder" refers to a binder which can be thermally decomposed in the thermal bonding step. It is preferable that the thermally decomposable binder hardly remains in the sintered layer (the first pre-sintering layer 52 after being heated) after the thermal bonding step. Examples of the thermally decomposable binder include a material having a carbon concentration of 15% by weight or less obtained by energy dispersive X-ray spectrometry after being heated from 23° C. to 400° C. in the air atmosphere at a heating rate of 10° C./min even if the first pre-sintering layer 52 contains the material. For example, by adopting a material which is more likely to be thermally decomposed as the thermally decomposable binder, the material is allowed to hardly remain in the sintered layer (the first pre-sintering layer 52 after being heated) after the thermal bonding step even if the content of the material is comparatively increased.

Examples of the thermally decomposable binder include polycarbonate, an acrylic resin, ethylcellulose, and polyvinyl alcohol. These materials can be used singly or in combination of two or more. Among these, from the viewpoint of high thermal decomposability, polycarbonate is preferable.

The polycarbonate is not particularly limited as long as the polycarbonate can be thermally decomposed in the thermal bonding step. Examples of the polycarbonate include aliphatic polycarbonate containing an aliphatic chain without containing an aromatic compound (for example, a benzene ring or the like) between ester carbonate groups (—O—CO—O—) as a main chain, and aromatic polycarbonate containing an aromatic compound between ester carbonate groups (—O—CO—O—) as a main chain. Among these, aliphatic polycarbonate is preferred.

Examples of the aliphatic polycarbonate include polyethylene carbonate and polypropylene carbonate. Among these, polypropylene carbonate is preferred from the viewpoint of solubility in an organic solvent when a varnish for forming a sheet is produced.

Examples of the aromatic polycarbonate include those having a bisphenol A structure as a main chain.

The weight average molecular weight of the polycarbonate is suitably in a range of 10,000 to 1,000,000. The weight average molecular weight is a value that is measured by GPC (gel permeation chromatography) and calculated in terms of polystyrene.

Examples of the acrylic resin include a polymer (acrylic copolymer) containing, as a component or components, one or more esters of acrylic acid or methacrylic acid having a linear or branched alkyl group having 30 or less carbon atoms, in particular, 4 to 18 carbon atoms in a range in which the acrylic resin can be thermally decomposed in the thermal bonding step. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Other monomers that form the polymer (acrylic copolymer) are not especially limited, and examples thereof include carboxyl group-containing monomers such as acrylic acid, methacrylic acid, carboxyethyl acrylate, carboxypentyl acrylate, itaconic acid, maleic acid, fumaric acid, and crotonic acid, acid anhydride monomers such as maleic anhydride and itaconic anhydride, hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate, sulfonic acid group-containing monomers such as styrene sulfonate, allyl sulfonate, 2-(meth)acrylamide-2-methylpropane sulfonic acid, (meth)acrylamidepropane sulfonic acid, sulfopropyl(meth)acrylate, and (meth)acryloyloxynaphthalene sulfonic acid, and phosphate group-containing monomers such as 2-hydroyethylacryloyl phosphate.

Among the acrylic resins, those more preferably have a weight average molecular weight of 10,000 to 1,000,000, and still more preferably 30,000 to 700,000. When the weight average molecular weight is in the above range, adhesion before the thermal bonding step and thermal decomposition property during the thermal bonding step become excellent. The weight average molecular weight is a value that is measured by GPC (gel permeation chromatography) and calculated in terms of polystyrene.

Among the acrylic resins, an acrylic resin thermally decomposed at 200° C. to 400° C. is preferred.

The first pre-sintering layer 52 may appropriately contain, other than the above-mentioned components, a plasticizer or the like, for example.

The first pre-sintering layer 52 can be manufactured by an ordinary method. For example, a varnish containing the respective components for forming the first pre-sintering layer 52 is produced. The varnish is applied onto a substrate separator to form a coating film so as to have a predetermined thickness, the coating film is then dried, and the first pre-sintering layer 52 is thereby manufactured.

A solvent that is used in the varnish is not particularly limited. However, an organic solvent or an alcoholic solvent is preferred which allows each of the above-described components to be dissolved, kneaded, or dispersed, uniformly. Examples of the organic solvent include ketone-based solvents such as dimethylformamide, dimethylacetamide, N-methylpyrrolidone, acetone, methylethylketone, and cyclohexanone; toluene; and xylene. Examples of the alcoholic solvent include ethylene glycol, diethylene glycol, 1,2-propanediol, 1,3-propanediol, 1,2-butanediol, 1,3-butanediol, 1,4-butanediol, 2-butene-1,4-diol, 1,2,6-hexanetriol, glycerin, octanediol, 2-methyl-2,4-pentanediol, and terpineol.

The applying method is not particularly limited. Examples of methods for coating a solvent include a die coater, a gravure coater, a roll coater, a reverse coater, a comma coater, a pipe doctor coater, and screen printing. Among these, a die coater is preferred in terms of high uniformity in an application thickness. The drying condition of the coating film is not particularly limited. For example, drying can be performed at a drying temperature of 70° C. to 160° C. for a drying time of 1 minute to 5 minutes. Even after the coating film is dried, some solvents may remain in the coating film without the solvents being wholly evaporated.

When the first pre-sintering layer 52 contains the low-boiling binder, a part of the low-boiling binder may be volatilized depending on the drying condition. Therefore, the ratios of the respective components constituting the first pre-sintering layer 52 vary according to the drying condition. For example, even in the first pre-sintering layer 52 formed of the same varnish, the content of the metal fine particles in the entire first pre-sintering layer 52 and the content of the thermally decomposable binder are increased as a drying temperature is higher and a drying time is longer. Therefore, the drying condition is preferably set so that the metal fine particles and the thermally decomposable binder are contained in desired amounts in the first pre-sintering layer 52.

Polyethylene terephthalate (PET), polyethylene, polypropylene, and a plastic film or a paper or the like whose surface is coated with a peeling agent such as a fluorine based peeling agent and a long chain alkylacrylate based peeling agent can be used as the substrate separator.

A method for mixing each of the above-described components with a mixer and press-molding the obtained mixture to manufacture the first pre-sintering layer 52 is also suitable as the method for manufacturing the first pre-sintering layer 52. Examples of the mixer include a planetary mixer.

The first pre-sintering layer 52 is preferably sandwiched between two separators. That is, the first pre-sintering layer 52 is preferably sandwiched between two separators such that a separator 52a, the first pre-sintering layer 52, and a separator 52b are stacked in this order (see FIG. 4). As the separator 52a and the separator 52b, the same separator as the substrate separator can be used.

(Second Pre-Sintering Layer)

A second pre-sintering layer 54 can have the same configuration as that of the first pre-sintering layer 52. The second pre-sintering layer 54 may have exactly the same configuration as that of the first pre-sintering layer 52. The second pre-sintering layer 54 may have a configuration different from that of the first pre-sintering layer 52 in the range described in the section of the first pre-sintering layer 52.

The first pre-sintering layer 52 and the second pre-sintering layer 54 have been described above.

Next, a semiconductor device manufacturing method according to the present embodiment will be described with reference to the drawings.

Each of FIGS. 1 to 11 is a schematic cross-sectional diagram for describing a semiconductor device manufacturing method according to the present embodiment.

(Semiconductor Device Manufacturing Method)

A semiconductor device manufacturing method according to the present embodiment includes:

a step A of obtaining a laminated body in which a semiconductor element is temporarily adhered on a first electrode formed on a first insulating substrate, with a first pre-sintering layer sandwiched therebetween;

a step B of, after the step A, temporarily adhering the semiconductor element on a second electrode formed on a second insulating substrate, with a second pre-sintering layer sandwiched therebetween, the second pre-sintering layer being provided on a side opposite to the first pre-sintering layer, to obtain a semiconductor device precursor; and a step C of simultaneously heating the first pre-sintering layer and the second pre-sintering layer after the step B, to bond the semiconductor element to the first electrode and the second electrode.

[Step A]

In the semiconductor device manufacturing method according to the present embodiment, first, a laminated body 10 shown in FIG. 1 is obtained. The laminated body 10 has a configuration in which a semiconductor element 42 is temporarily adhered on a first electrode 24 formed on a first insulating substrate 22 with a first pre-sintering layer 52 sandwiched therebetween.

The laminated body 10 includes a support layer 26 provided on the back surface of the first insulating substrate 22 (the surface provided on a side opposite to the surface on which the first electrode 24 is formed). In order to prevent conduction between a plurality of first electrodes 24, a cover layer 28 is provided on the outer peripheral portion of each of the first electrodes 24. The cover layer 28 is provided on the first insulating substrate 22 on which the first electrode 24 is not provided. As in the present embodiment, the cover layer 28 may be formed so as to partially cover the first electrode 24 on the outer peripheral portion of the first electrode 24.

Hereinafter, a specific method of obtaining the laminated body 10 will be described.

The laminated body 10 can be obtained by the following steps:

a step A-1 of preparing a lower substrate 20 including a first insulating substrate 22 and a first electrode 24 formed on the first insulating substrate 22;

a step A-2 of preparing a semiconductor element 42 in which the first pre-sintering layer 52 is stacked on one surface and the second pre-sintering layer 54 is stacked on the other surface; and a step A-3 of temporarily adhering the semiconductor element 42 prepared in the step A-2 on the first electrode 24 with the first pre-sintering layer 52 sandwiched therebetween.

[Step A-1]

In the step A-1, the lower substrate 20 is prepared.

Figure 2:
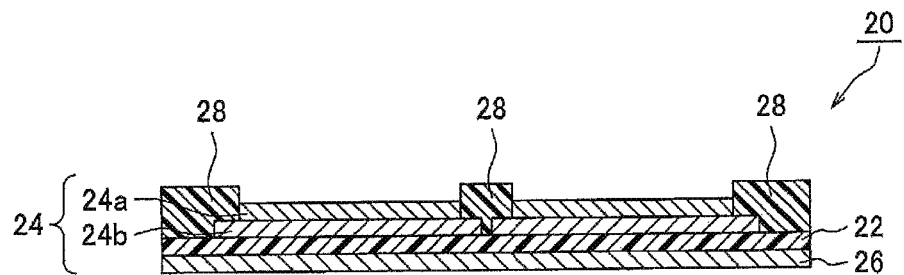
FIG. 2 is a schematic cross-sectional view for describing a semiconductor device manufacturing method according to an embodiment.

As shown in FIG. 2, the lower substrate 20 includes the first insulating substrate 22, the first electrode 24 formed on a part of the upper surface of the first insulating substrate 22, a support layer 26 stacked on the back surface of the first insulating substrate 22, and a cover layer 28. As described above, the cover layer 28 is formed on the first insulating substrate 22 on which the first electrode 24 is not provided, and is formed so as to partially cover the first electrode 24.

The material of the first insulating substrate 22 is not particularly limited as long as the first insulating substrate 22 has electrical insulation properties, and examples thereof include resins such as a polyester resin, an epoxy resin, a urethane resin, a polystyrene resin, a polyethylene resin, a polyamide resin, a polyimide resin, an ABS resin, a polycarbonate resin, and a silicone resin, and ceramics. Among these, from the viewpoint of heat resistance, the polyimide resin and the ceramics are preferable.

The use of the resins such as the polyimide resin allows the first insulating substrate 22 to have flexibility. The use of the ceramics allows the first insulating substrate 22 to be made solid so that the insulating substrate 22 cannot be bent.

Examples of the material of the first electrode 24 include various metals such as gold, silver, copper, nickel, and cobalt, or various alloys mainly containing these metals. In the present embodiment, the first electrode 24 is a two-layer electrode in which a gold electrode 24a and a copper electrode 24b are stacked. However, in the present invention, the first electrode is not limited to this example, and may be composed of one layer, or be composed of three or more layers.

The support layer 26 is a layer for imparting elasticity or rigidity to the lower substrate 20 when the first insulating substrate and the first electrode have flexibility. Examples of the support layer 26 include a plate having rigidity (for example, a copper plate, an SUS plate, an aluminum plate, a titanium plate, or the like), and an elastic sheet (a copper foil, an SUS foil, an aluminum foil, a polyimide film, a liquid crystal polymer film, a PET film, or the like).

The material of the cover layer 28 is not particularly limited as long as the cover layer 28 has electrical insulation properties, and examples thereof include resins such as a polyester resin, an epoxy resin, a urethane resin, a polystyrene resin, a polyethylene resin, a polyamide resin, a polyimide resin, an ABS resin, a polycarbonate resin, and a silicone resin, and an acrylic resin (solder resist). Among these, the polyimide resin is preferable from the viewpoint of heat resistance.

In the present embodiment, the case where the lower substrate 20 includes the first insulating substrate 22, the first electrode 24, the support layer 26, and the cover layer 28 will be described. However, in the present invention, the lower substrate is not limited to this example as long as the lower substrate has the first insulating substrate and the first electrode. The support layer 26 may be omitted. The cover layer 28 may also be omitted.

[Step A-2]

In the step A-2, the semiconductor element 42 is prepared, in which the first pre-sintering layer 52 is stacked on one surface and the second pre-sintering layer 54 is stacked on the other surface.

The semiconductor element 42 in which the first pre-sintering layer 52 is stacked on one surface and the second pre-sintering layer 54 is stacked on the other surface can be obtained by the following steps X and Y:

the step X of forming the first pre-sintering layer on one surface of a semiconductor wafer and forming the second pre-sintering layer on the other surface of the semiconductor wafer, to obtain the semiconductor wafer including the pre-sintering layer formed on each surface; and the step Y of making the semiconductor wafer obtained in the step X and including the pre-sintering layer formed on each of both the surfaces into individual pieces.

[Step X]

Figure 3:
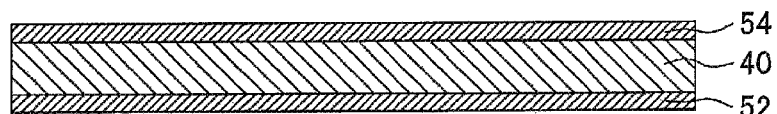
FIG. 3 is a schematic cross-sectional view for describing a semiconductor device manufacturing method according to an embodiment.

In the step X, as shown in FIG. 3, the first pre-sintering layer 52 is formed on one surface of a semiconductor wafer 40, and the second pre-sintering layer 54 is formed on the other surface, to obtain a semiconductor wafer including the pre-sintering layer formed on each surface.

The step X may be a step in which the sheet-like first pre-sintering layer 52 is stacked on one surface of the semiconductor wafer 40, and the sheet-like second pre-sintering layer 54 is stacked on the other surface, to obtain a semiconductor wafer including the pre-sintering layer formed on each surface. That is, the step X may be a step in which the first pre-sintering layer and the second pre-sintering layer are in the form of a sheet, and the sheet-like first pre-sintering layer 52 and the sheet-like second pre-sintering layer 54 are pasted on the semiconductor wafer 40.

In this case, the sheet-like pre-sintering layer has a relatively uniform thickness. Therefore, in this case, the inclination of the semiconductor element can be further suppressed.

Figure 4:
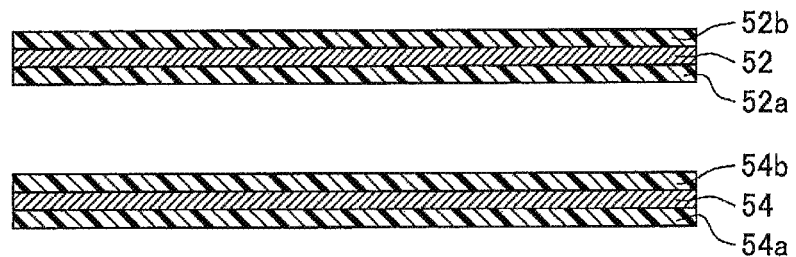
FIG. 4 is a schematic cross-sectional view for describing a semiconductor device manufacturing method according to an embodiment.

The sheet-like pre-sintering layer is usually prepared in a state where a separator is pasted on each of the surfaces of the sheet-like pre-sintering layer. FIG. 4 shows a state in which the separator 52a and the separator 52b are pasted on both the surfaces of the sheet-like first pre-sintering layer 52. FIG. 4 also shows a state in which a separator 54a and a separator 54b are pasted on both the surfaces of the sheet-like second pre-sintering layer 54.

When the sheet-like pre-sintering layer is pasted on the semiconductor wafer 40, one of the separators is peeled off, and the sheet-like pre-sintering layer is then pasted.

Figure 5:
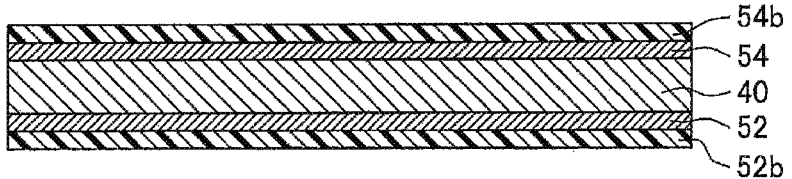
FIG. 5 is a schematic cross-sectional view for describing a semiconductor device manufacturing method according to an embodiment.
Figure 6:
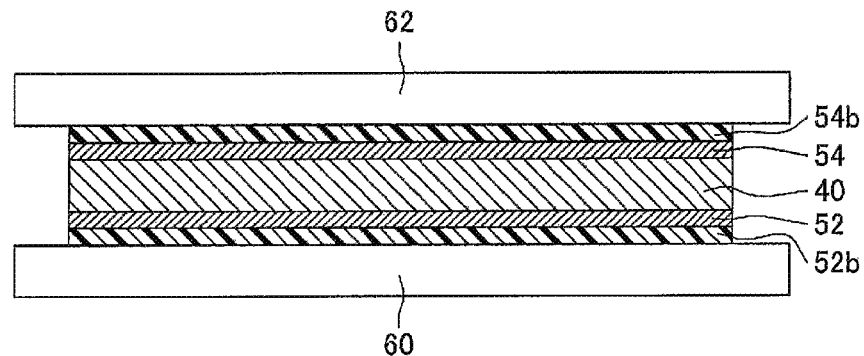
FIG. 6 is a schematic cross-sectional view for describing a semiconductor device manufacturing method according to an embodiment.

More specifically, as shown in FIG. 5, first, the semiconductor wafer 40 is placed on the first pre-sintering layer 52 from which the separator 52a has been peeled off, and the second pre-sintering layer 54 from which the separator 54a has been peeled off is placed on the semiconductor wafer 40. Then, pasting is performed under pressure. For example, as shown in FIG. 6, the first pre-sintering layer 52 and the second pre-sintering layer 54 can be pasted on both the surfaces of the semiconductor wafer 40 by a flat plate press in a state of being placed between a lower heating plate 60 and an upper heating plate 62. It is preferable that a pasting pressure is in the range of 0.01 to 10 MPa. A pasting temperature during pasting is not particularly limited, and it is preferably in the range of 23 to 90° C., for example.

The pasting may be performed as follows. The first pre-sintering layer 52 from which one of the separators has been peeled off is placed on the lower heating plate 60; the semiconductor wafer 40 is then placed on the first pre-sintering layer 52; the second pre-sintering layer 54 from which one of the separators has been peeled off is then placed; and the first pre-sintering layer 52 and the second pre-sintering layer 54 are finally pasted on both the surfaces of the semiconductor wafer 40 under pressure by the lower heating plate 60 and the upper heating plate 62.

[Step Y]

Figure 7:
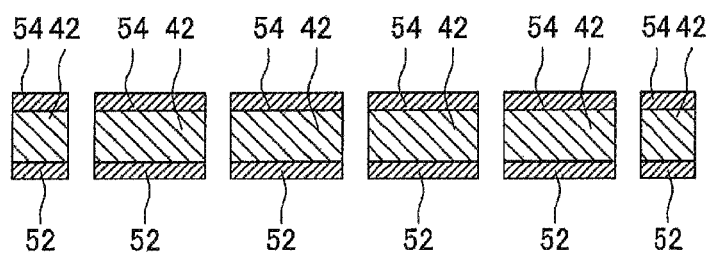
FIG. 7 is a schematic cross-sectional view for describing a semiconductor device manufacturing method according to an embodiment.

In the step Y, as shown in FIG. 7, the semiconductor wafer 40 obtained in the step X and including the pre-sintering layer formed on each of both the surfaces is made into individual pieces.

Specifically, the separator 52b is peeled off from the first pre-sintering layer 52, and pasted on a dicing tape (not shown). Next, the separator 54b is peeled off from the second pre-sintering layer 54. The semiconductor wafer 40 is then diced into individual pieces.

As the dicing tape, a conventionally known dicing tape can be adopted, and therefore the description thereof will be omitted. As a dicing method, a conventionally known method can be adopted using a conventionally known dicing device, and therefore the description thereof will be omitted. Examples thereof include a method using a dicing blade, and a method of splitting after laser irradiation.

As described above, the semiconductor element 42 is obtained, in which the first pre-sintering layer 52 is stacked on one surface and the second pre-sintering layer 54 is stacked on the other surface.

In the above embodiment, the case where the separator 52b and the separator 54b are peeled off before dicing has been described. However, the timing of peeling off the separator 52b and the separator 54b is not limited to this example. For example, the separator 52b and the separator 54b may be peeled off after dicing. However, the case where the separator 52b and the separator 54b are peeled off before dicing is excellent in that the separator 52a and the separator 52a can be collectively peeled off before the semiconductor element 42 is made into individual pieces. The case where the separator 52b and the separator 54b are peeled off after dicing is excellent in that the pre-sintering layer can be protected just before temporary adhesion.

In the above example, the case where the sheet-like first pre-sintering layer and the sheet-like second pre-sintering layer are used has been described. However, the present invention is not limited to this example, and a liquid composition for forming the first pre-sintering layer and a liquid composition for forming the second pre-sintering layer may be used.

That is, the step X may be a step in which a liquid composition for forming a first pre-sintering layer is applied to one surface of the semiconductor wafer 40 to form the first pre-sintering layer 52, and a liquid composition for forming a second pre-sintering layer is applied to the other surface to form the second pre-sintering layer 54, thereby obtaining the semiconductor wafer including the pre-sintering layer formed on each of both the surfaces.

A liquid composition for forming a pre-sintering layer may be applied to one surface of the semiconductor wafer 40, a sheet-like pre-sintering layer may be pasted on the other surface.

[Step A-3]

In the step A-3, the semiconductor element 42 prepared in the step A-2 is temporarily adhered on the first electrode 24 of the lower substrate 20 with the first pre-sintering layer 52 sandwiched therebetween (see FIG. 1). In this step, a plurality of semiconductor elements 42 are temporarily adhered on each first electrode 24 using a chip mounter or the like. As a temporary adhesion condition, temporary adhesion is preferably performed under pressure of 0.01 MPa to 5 MPa. A temperature during temporary adhesion is not particularly limited, and it is preferably in the range of 23 to 150° C., for example. A pressure time is preferably 0.01 to 5 seconds.

The method of obtaining the laminated body 10 (step A) has been described above.

[Step B]

Figure 9:
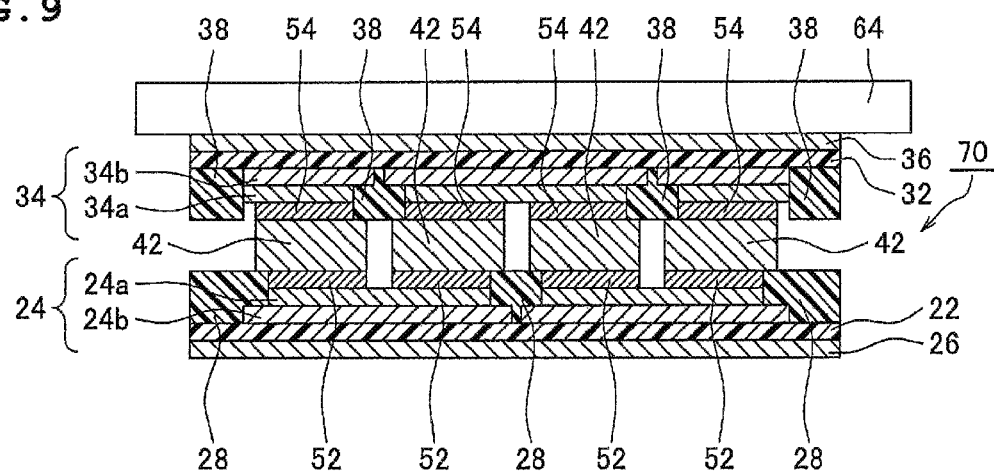
FIG. 9 is a schematic cross-sectional view for describing a semiconductor device manufacturing method according to an embodiment.

After the step A, the semiconductor element 42 is temporarily adhered on the second electrode 34 formed on a second insulating substrate 32 with the second pre-sintering layer 54 provided on the side opposite to the first pre-sintering layer 52 sandwiched therebetween, to obtain a semiconductor device precursor 70 (see FIG. 9).

Hereinafter, a specific method of obtaining the semiconductor device precursor 70 will be described.

The semiconductor device precursor 70 can be obtained by the following steps:

a step B-1 of preparing an upper substrate 30 including the second insulating substrate 32 and a second electrode 34 formed on the second insulating substrate 32; and a step B-2 of temporarily adhering the semiconductor element 42 of the laminated body 10 obtained in the step A and the second electrode 34 of the upper substrate 30 with the second pre-sintering layer 54 sandwiched therebetween.
[Step B-1]

In the step B-1, the upper substrate 30 is prepared.

Figure 8:
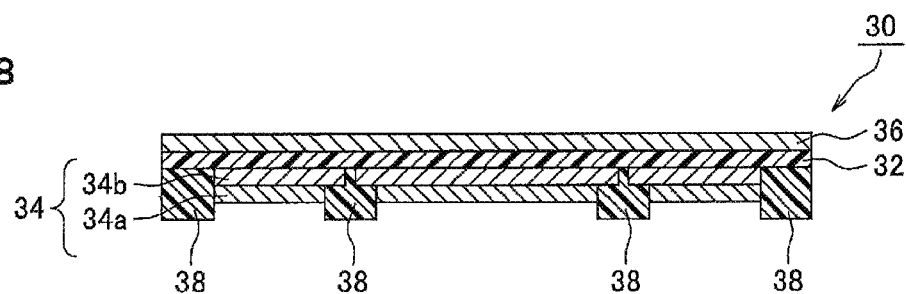
FIG. 8 is a schematic cross-sectional view for describing a semiconductor device manufacturing method according to an embodiment.

As shown in FIG. 8, the upper substrate 30 includes the second insulating substrate 32, the second electrode 34 formed on a part of the upper surface of the second insulating substrate 32, a support layer 36 stacked on the back surface of the second insulating substrate 32, and a cover layer 38. The cover layer 38 is formed on the second insulating substrate 32 on which the second electrode 34 is not provided, and is formed so as to partially cover the second electrode 34.

The second electrode 34 of the upper substrate 30 and the first electrode 24 of the lower substrate 20 are disposed so as to have an opposed positional relationship when a semiconductor device 80 (see FIG. 11) is manufactured, and disposed so that a plurality of semiconductor elements 42 are electrically connected in series when the plurality of semiconductor elements 42 are sandwiched therebetween.

As the material of the second insulating substrate 32, the same material as that of the first insulating substrate 22 can be used.

As the material of the second electrode 34, the same material as that of the second electrode 34 can be used.

As the support layer 36, the same configuration as that of the support layer 26 can be adopted.

As the cover layer 38, the same configuration as that of the cover layer 28 can be adopted.
[Step B-2]

In the step B-2, as shown in FIG. 9, the semiconductor element 42 of the laminated body 10 obtained in the step A and the second electrode 34 of the upper substrate 30 are temporarily bonded with the second pre-sintering layer 54 sandwiched therebetween.

In this step, the upper substrate 30 is placed on the laminated body 10, and then temporarily adhered on the laminated body 10 by heating using an upper heating plate 64. A temperature during temporary adhesion is not particularly limited, and it is preferably in the range of 23 to 150° C., for example. A heating time is preferably 1 to 100 seconds. Pressure may be performed, and temporary adhesion is preferably performed under pressure of 0.01 MPa to 5 MPa, for example.

The method of obtaining the semiconductor device precursor 70 (step B) has been described above.
[Step C]

After the step B, the first pre-sintering layer 52 and the second pre-sintering layer 54 are simultaneously heated, to bond the semiconductor element 54 to the first electrode 24 and the second electrode 34.

Figure 10:
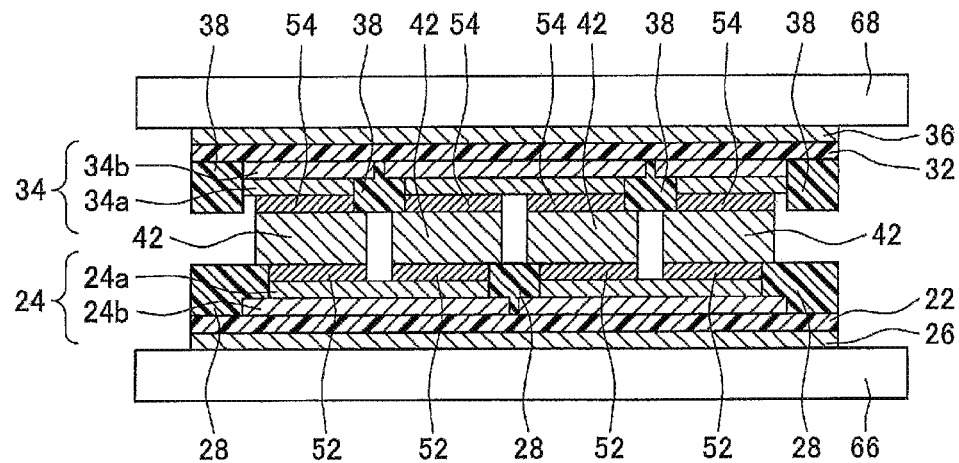
FIG. 10 is a schematic cross-sectional view for describing a semiconductor device manufacturing method according to an embodiment.
Figure 11:
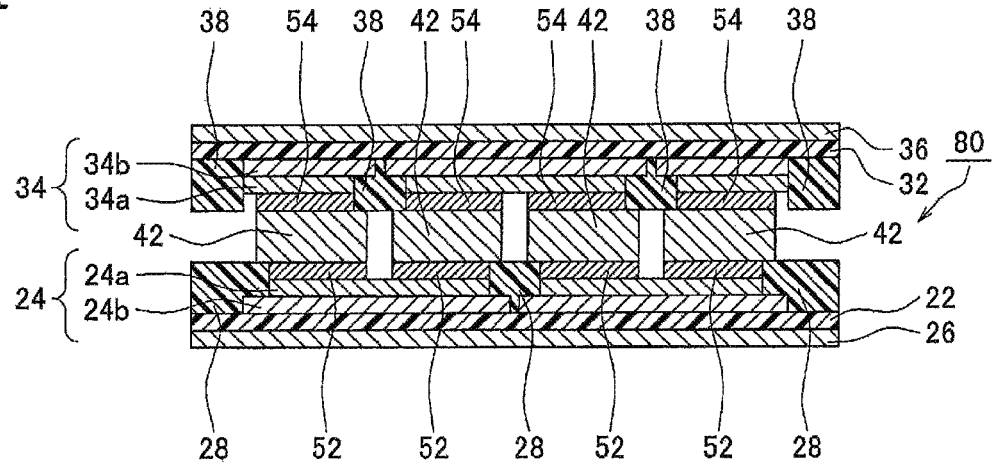
FIG. 11 is a schematic cross-sectional view for describing a semiconductor device manufacturing method according to an embodiment.

In this bonding step C (thermal bonding step), the metal fine particles in the first pre-sintering layer 52 and the second pre-sintering layer 54 are sintered by heating, and the thermally decomposable binder is thermally decomposed as necessary. The residual low-boiling binder which has not been sufficiently volatilized in the drying step is volatilized. A heating temperature is preferably 180 to 400° C., more preferably 190 to 370° C., and still more preferably 200 to 350° C. A heating time is preferably 0.3 to 300 minutes, more preferably 0.5 to 240 minutes, and still more preferably 1 to 180 minutes. Thermal bonding may be performed under a pressurized condition. The pressurized condition is preferably in the range of 1 to 500 kg/cm$^2$, and more preferably in the range of 5 to 400 kg/cm$^2$. Thermal bonding under pressure can be executed by a device which can simultaneously perform heating and pressurizing, such as a flip chip bonder, for example. As shown in FIG. 10, a parallel plate press including a lower heating plate 66 and an upper heating plate 68 may also be used. Thus, the semiconductor device 80 (see FIG. 11) is obtained.

The semiconductor device manufacturing method according to the present embodiment has been described above.

The semiconductor element 42 is preferably a thermoelectric element. When the semiconductor element 42 is the thermoelectric element, a thermoelectric conversion module can be provided, in which the positional deviation or inclination of the thermoelectric element is suppressed.

When the semiconductor element 42 is the thermoelectric element, each of the plurality of semiconductor elements 42 is a P-type thermoelectric element or an N-type thermoelectric element, and these are alternately and electrically connected in series.

EXAMPLES

Hereinafter, the present invention will be described in detail by way of examples. However, the present invention is not limited to the examples below as long as the present invention does not exceed the gist thereof.

Components used in examples will be described.

Metal fine particles-containing paste A: obtained by appropriately adjusting the amount of a low-boiling binder contained in ANP-1 (paste in which nano-sized fine silver particles are dispersed in the low-boiling binder) manufactured by Applied Nanoparticle Laboratory Corporation Thermally decomposable binder A (polypropylene carbonate resin): QPAC 40 manufactured by Empower Materials Inc., solid at 23° C.

Thermally decomposable binder B (acrylic resin): MM-2002-1 manufactured by Fujikura Kasei Co., Ltd., solid at 23° C.

Organic solvent A: Methyl ethyl ketone (MEK)
[Production of Pre-Sintering Layer]

According to the ratio of blending of compounds described in Table 1, each component and solvent described in Table 1 were placed in a stirring pot of a hybrid mixer (HM-500 manufactured by KEYENCE CORPORATION), and were stirred and mixed in a stirring mode for 3 minutes.

The obtained varnish was applied onto a released-treated film (MRA50 manufactured by Mitsubishi Plastics, Inc.), followed by drying. The drying conditions were as shown in Table 1.
[Production and Evaluation of Semiconductor Device]

As a lower substrate, a flexible printed circuit board (FPC) was prepared. In this flexible printed circuit board, a first electrode having a three-layer configuration of gold/(electroless) nickel/copper was formed on a first insulating substrate composed of a polyimide film. One first electrode had a length of 3 mm and a width of 7 mm, and two chips each having a length of 2 mm and a width of 2 mm were mounted with a distance of 1 mm at the center on the first electrode. The first electrodes (10 in the length direction×6 in the width direction) were arrayed with a distance of 1 mm on the first insulating substrate.

The same substrate as the lower substrate was prepared as an upper substrate.

On the other hand, a semiconductor wafer having a thickness of 2 μm was prepared, and a pre-sintering layer of examples was pasted on each surface of the semiconductor wafer. The pasting conditions of 80° C., 0.5 MPa, and 10 seconds were set with a parallel plate press. The same pre-sintering layers were pasted on both the surfaces.

Next, the semiconductor wafer including the pre-sintering layer pasted on each of both the surfaces was pasted on a dicing tape (NBD-5172K manufactured by Nitto Denko Corporation).

Next, dicing was performed using a dicing device (manufactured by Disco Corporation, device name: DFD-6361). As a result, the semiconductor wafer and the pre-sintering layer pasted on each of both the surfaces were made into individual pieces. The dicing conditions were as follows: dicing ring: 2-8-1 (manufactured by Disco Corporation), dicing rate: 30 mm/sec, dicing blade: B1A8015DC320N50M51 (manufactured by Disco Corporation), dicing blade rotation number: 30000 rpm, blade height: 50 μm from chuck table surface, cut method: A mode/single cut, wafer chip size: 2 mm square.

Next, the individual piece of the semiconductor wafer (hereinafter also referred to as a chip) was temporarily adhered on the electrode of the lower substrate. Temporary adhesion conditions of 80° C., 0.5 MPa, and 0.5 seconds were set with a chip mounter.

Next, the upper substrate was placed on the chip, and then temporarily adhered on the chip. The temporary adhesion conditions of 80° C., 0.5 MPa, and 10 seconds were set with a parallel plate press.

Next, heating was performed under the conditions of 300° C., 90 seconds, and 1 MPa in the parallel plate press. This caused the chip and the electrode to be bonded to each other.

For the samples produced as described above, the sample in which the chip and the electrode were bonded to each other was evaluated as "○", and the sample in which the chip and the electrode were not bonded to each other was evaluated as "x". The results are shown in Table 1.

[Measurement of Temporary Adhesion Shear Strength]

The pre-sintering layer produced in examples was pasted on a test chip (semiconductor chip, length: 2 mm×width: 2 mm, thickness: 3 mm) under the conditions of 0.5 MPa, 10 seconds, and 80° C. by a parallel plate press. Next, the shear strength (shear strength assumed during temporary adhesion) at room temperature (24° C.) was measured.

Specifically, the shear strength was measured under the following conditions using Bond Tester 5000 Series for ultra-fine pitch bonding, manufactured by Nordson Advanced Technology Japan K. K. (former name: Dage Japan Co., Ltd.). The results are shown in Table 1.

In this measurement, the test chip was broken before being peeled off. Therefore, Table describes values at break. Therefore, the actual share strength is higher than the values. Table also shows a portion of a broken interface.

<Shear Strength Measurement Conditions>
Load cell: BS250
Measurement range: 250 g
Test type: Destructive test
Test speed: 100 μm/s
Descent speed: 100 μm/s
Test height: 100 μm
Tool movement amount: 2000 μm
Destructive recognition point: High (90%)

[Measurement of Shear Strength after being Sintered]

The pre-sintering layer produced in examples was pasted on a test chip (semiconductor chip, length: 2 mm×width: 2 mm, thickness: 3 mm) under the conditions of 0.5 MPa, 10 seconds, and 80° C. by a parallel plate press. Next, heating was performed in a parallel plate press under the conditions of 1 MPa, 90 seconds, and 300° C. This provided a sintered layer from the pre-sintering layer. Then, the shear strength (shear strength assumed after thermal bonding) at room temperature (24° C.) was measured.

Specifically, the shear strength was measured under the following conditions using Multipurpose Bond Tester 4000 series manufactured by Nordson Advanced Technology Japan K. K. (former name: Dage Japan Co., Ltd.).

In this measurement, the test chip was broken before being peeled off. Therefore, Table describes values at break. Therefore, the actual share strength is higher than the values. Table also shows a portion of a broken interface.

<Shear Strength Measurement Conditions>
Load cell: DS100 kg
Measurement range: 100 kg
Test type: Destructive test
Test speed: 100 μm/s
Descent speed: 100 μm/s
Test height: 100 μm
Tool movement amount: 2000 μm
Destructive recognition point: High (90%)

[Measurement Using Nanoindenter]

A semiconductor chip (bismuth-tellurium alloy (BiTe) chip) was prepared, which included a Ni layer (thickness: 2 to 5 μm (average: about 3.5 μm)) and an Au layer (thickness: 50 nm) formed in this order on a back surface. The semiconductor chip had a thickness of 500 μm, a length of 5 mm, and a width of 5 mm. The pre-sintering layer of examples was pasted on the Au layer surface of the prepared semiconductor chip.

The pasting conditions of 0.5 MPa, 10 seconds, and 80° C. were set with a parallel plate press.

A copper plate (copper plate thickness: 3 mm) entirely covered with an Ag layer (thickness: 5 μm) was prepared. On the prepared copper plate, a pre-sintering layer with a semiconductor chip was bonded under the following conditions. Thus, a sample for evaluation was obtained. For the bonding, a sintering device (HTM-3000 manufactured by Hakuto Co., Ltd.) was used.

<Bonding Conditions>

The pre-sintering layer was heated from 80° C. to 300° C. at a heating rate of 1.5° C./sec under pressure of 10 MPa (flat plate press), and then held at 300° C. for 2.5 minutes. Then, the pre-sintering layer was air-cooled to 170° C., and then water-cooled to 80° C. The water-cooling is provided by a water-cooling type cooling plate provided in a pressurizing plate.

Then, the sample was embedded in an epoxy resin (cured resin manufactured by SCANDIA (2-pack type, SCANDIPLEX A, SCANDIPLEX B)).

<Embedding Conditions>
SCANDIPLEX A:SCANDIPLEX B=9:4 (volume ratio)
left at 45° C. for 1 to 2 hours After embedding, the diagonal cross-section of the semiconductor chip was exposed by a mechanical polishing method. In the mechanical polishing, rough polishing was performed, and precise polishing was then performed. As a polishing device for rough polishing, RotoPol-31 manufactured by Struers was used. As a polishing device for precise polishing, a precise polishing device MultiPrep manufactured by ALLIED was used. The rough polishing conditions and the precise polishing conditions were as follows.

<Rough Polishing Conditions>
Waterproof abrasive paper: SiC Foil #220 manufactured by Struers
Disk rotation number: 150 rpm <Precise Polishing Conditions>
Waterproof abrasive paper: SiC Foil #220, #1000 manufactured by Struers
Disk rotation number: 100 rpm
Load: 200 to 500 g Then, the vicinity of the center of the exposed surface was ion-polished. As the device, a cross section polisher SM-09010 manufactured by JEOL Ltd. was used, and the conditions of ion polishing were as follows.

<Ion Polishing Conditions>
Acceleration voltage: 5 to 6 kV
Processing time: 8 to 10 hours
Amount of protrusion from shielding plate: 25 to 50 μm Pushing was performed under the following pushing conditions using a nanoindenter (Triboindeter manufactured by Hysitron, Inc.) for the total of three points, that is, the center of the cross section of the exposed sintered layer and the positions separated by 20 μm in left and right from the center. As a result, a load-displacement curve was obtained. A projected image of an indenter (image of traces provided by pushing the indenter) was obtained.

<Pushing Conditions>

Indenter to be used: Berkovich [triangular pyramid shape])

Measuring method: Single pushing measurement mode

Measurement temperature: 25° C. (room temperature)

Pushing depth setting: 2 μm

From the load-displacement curve and the projected area of the indenter, values of hardness, modulus of elasticity, and deformation amount were obtained by calculation. The hardness and the modulus of elasticity were calculated in detail with the device. Specifically, detailed calculation methods are described in, for example, Handbook of Micro/nano Tribology (Second Edition) Edited by Bharat Bhushan, CRC Press (ISBN 0-8493-8402-8), and therefore the description thereof will be omitted. The results are shown in Table 1.

Figure 12:
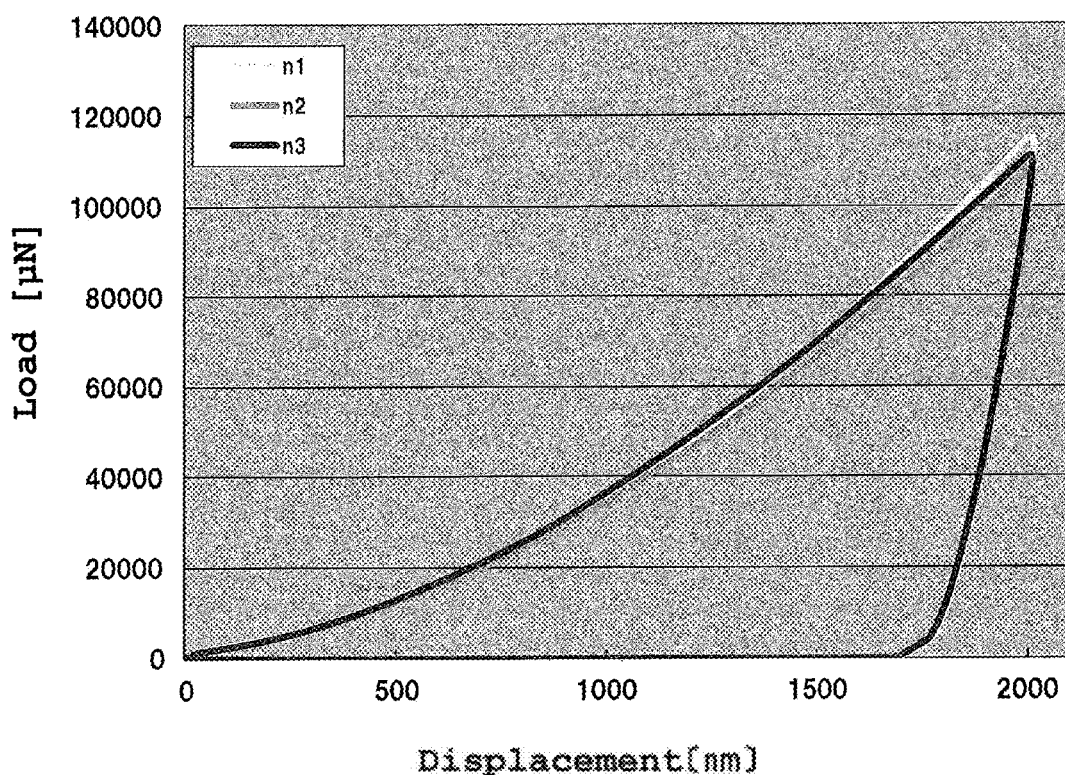
FIG. 12 is a diagram showing an example of a load-displacement curve.

Here, the load-displacement curve will be described. FIG. 12 is a diagram showing an example of the load-displacement curve. A horizontal axis indicates a displacement amount (pushing amount), and a vertical axis indicates a load. Since, during pushing, the load is applied together with pushing, plotting is made from the position of a displacement amount of 0 and a load of 0 to the upper right. Then, when the displacement amount reaches 2 μm and the pushing is released, the deformed bonded layer is partially restored. At this time, the displacement when the load reaches 0 is read, and taken as a deformation amount.

Figure 13:
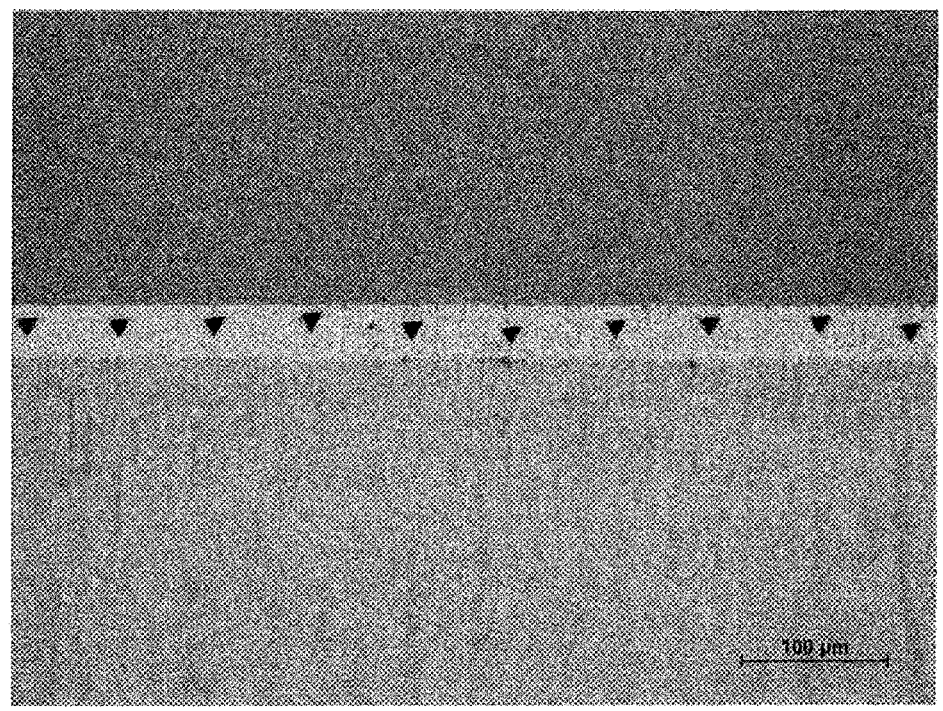
FIG. 13 is a diagram for describing the projection image of an indenter.

Next, the projection image of the indenter will be described. FIG. 13 is a diagram for describing the projection image of the indenter. In FIG. 13, a lower layer is a copper plate, a middle layer is a sintered layer, and an upper layer is a semiconductor chip. A black triangle on the sintered layer is a trace (projected image) after pushing the indenter. The projected area of the indenter is obtained from the area of this image. FIG. 13 is a diagram for describing a projected image of an indenter using a nanoindenter, which does not belong to examples or comparative examples.

TABLE 1

| | | | Example 1 | Example 2 |
|---|---|---|---|---|
| Formulation | Metal fine particles-containing paste A (parts by weight) | ANP-1 | 100 | 100 |
| | Thermally decomposable binder A (parts by weight) | QPAC40 | 1 | — |
| | Thermally decomposable binder B (parts by weight) | MM-2002-1 | — | 1 |
| | Organic solvent A (parts by weight) | Methyl ethyl ketone | 35 | 35 |
| Dry conditions | | Temperature [° C.] | 150 | 150 |
| | | Time [sec] | 5 | 5 |
| Evaluation | Thickness of pre-sintering layer [μm] | | 45 | 45 |
| | Evaluation of bonding properties | | ○ | ○ |
| | Hardness after being bonded (sintered) [GPa] | | 4.3 | 2.1 |
| | Modulus of elasticity after being bonded (sintered) [GPa] | | 125 | 81 |
| | Deformation amount after being bonded (sintered) [nm] | | 1700 | 1800 |
| | Temporary adhesion share strength [MPa] | | 0.15 | 0.39 |
| | Destructive (peeling-off) interface of temporary adhesion share strength test | | Electrode/bonding material | Electrode/bonding material |
| | Share strength after being sintered [MPa] | | 22.2 | 17.4 |
| | Destructive interface of share strength test after being sintered | | Inside of semiconductor device | Inside of semiconductor device |

DESCRIPTION OF REFERENCE SIGNS

10: Laminated body
20: Lower substrate
22: First insulating substrate
24: First electrode
26: Support layer
28: Cover layer
30: Upper substrate
32: Second insulating substrate
34: Second electrode
36: Support layer
38: Cover layer
40: Semiconductor wafer
42: Semiconductor element
52: First pre-sintering layer
52a, 52b: Separator
54: Second pre-sintering layer
54a, 54b: Separator
70: Semiconductor device precursor
80: Semiconductor device

The invention claimed is:

1. A semiconductor device manufacturing method comprising:
   a step A of obtaining a laminated body in which a semiconductor element is temporarily adhered on a first electrode formed on a first insulating substrate, with a first sheet-like pre-sintering layer sandwiched therebetween;
   a step B of, after the step A, temporarily adhering the semiconductor element on a second electrode formed on a second insulating substrate, with a second sheet-like pre-sintering layer sandwiched therebetween, the second sheet-like pre-sintering layer being provided on a side opposite to the first sheet-like pre-sintering layer, to obtain a semiconductor device precursor; and a step C of, after the step B, simultaneously heating the first sheet-like pre-sintering layer and the second sheet-like pre-sintering layer, to bond the semiconductor element to the first electrode and the second electrode, wherein the step A comprises:

a step A-1 of preparing a lower substrate including the first insulating substrate and the first electrode formed on the first insulating substrate;

a step A-2 of preparing the semiconductor element in which the first sheet-like pre-sintering layer is stacked on a first surface of the semiconductor element and the second sheet-like pre-sintering layer is stacked on a second surface of the semiconductor element; and a step A-3 of temporarily adhering the semiconductor element prepared in the step A-2 on the first electrode with the first sheet-like pre-sintering layer sandwiched therebetween, wherein the step A-2 comprises:

a step X of stacking the first sheet-like pre-sintering layer on a first surface of a semiconductor wafer, and stacking the second sheet-like pre-sintering layer on a second surface of the semiconductor wafer, to obtain the semiconductor wafer including the first sheet-like pre-sintering layer on the first surface of the semiconductor wafer and the second sheet-like presintering layer on the second surface of the semiconductor wafer; and a step Y of making the semiconductor wafer obtained in the step X and including the first sheet-like pre-sintering layer formed on the first surface of the semiconductor wafer and the second sheet-like pres-intering layer formed on the second surface of the semiconductor wafer into individual pieces wherein the first sheet-like pre-sintering layer and the second sheet-like pre-sintering layer contain a metal-based compound and a binder material.

2. The semiconductor device manufacturing method according to claim 1, wherein the semiconductor element is a thermoelectric element.

* * * * *